United States Patent [19]

Yamada et al.

[11] Patent Number: 5,306,949
[45] Date of Patent: Apr. 26, 1994

[54] TRANSISTOR MODULE HAVING EXTERNAL LEAD TERMINAL WITH TRANSIENT VOLTAGE SUPPRESSION

[75] Inventors: Toshifusa Yamada; Shuji Miyashita; Toshihisa Shimizu, all of Kanagawa

[73] Assignee: Fuji Electric Co., Ltd., Kanagawa, Japan

[21] Appl. No.: 973,276

[22] Filed: Nov. 9, 1992

[30] Foreign Application Priority Data

Nov. 25, 1991 [JP] Japan .................... 3-309146

[51] Int. Cl.⁵ .............................. H01L 23/50
[52] U.S. Cl. ..................... 257/690; 257/665; 257/692; 257/696; 257/784; 361/752; 361/772
[58] Field of Search ............... 257/665, 690, 691, 692, 257/696, 784; 361/399, 404

[56] References Cited

U.S. PATENT DOCUMENTS

| | | | |
|---|---|---|---|
| 3,961,415 | 6/1976 | Davis, Jr. ................. | 257/692 |
| 4,652,902 | 3/1987 | Takata et al. ............. | 257/784 |
| 4,704,320 | 11/1987 | Mizunoya et al. ........ | 257/692 |
| 4,885,629 | 12/1989 | Takagi ...................... | 257/690 |
| 4,945,398 | 7/1990 | Kurita et al. .............. | 257/696 |
| 4,984,051 | 1/1991 | Yoshida .................... | 257/690 |
| 5,162,894 | 11/1992 | Asano et al. .............. | 257/692 |

FOREIGN PATENT DOCUMENTS 2250379 10/1991 United Kingdom .

Primary Examiner—Rolf Hille
Assistant Examiner—David Ostrowski
Attorney, Agent, or Firm—Finnegan, Henderson, Farabow, Garrett & Dunner

[57] ABSTRACT

In an external lead terminal 5 of a transistor module, an intermediate terminal portion 6 and an external lead terminal 8 are conductively connected to each other via a U-shaped intermediate terminal portion 7 having a curved portion 7b. Connected in parallel with this intermediate terminal portion 7 is a shortcircuit wire 9 having a larger electric resistance and a smaller inductance than the same. For this reason, even if a current is reduced suddenly in a state in which the current is flowing from the external terminal portion 8 to the intermediate terminal portion 6 via the intermediate terminal portion 7, the current shifts to the shortcircuit wire 9 side, so that a transient voltage is low. Consequently, it is provided a transistor module capable of reducing a transient voltage without being subjected to restrictions in the size of an external lead terminal while maintaining a high level of reliability.

6 Claims, 4 Drawing Sheets

TRANSISTOR MODULE HAVING EXTERNAL LEAD TERMINAL WITH TRANSIENT VOLTAGE SUPPRESSION

BACKGROUND OF THE INVENTION

1. Field of the Invention

The present invention relates to a transistor module incorporating semiconductor devices and the like, and more particularly to a technique of reducing a transient voltage which is generated owing to an external lead terminal thereof.

2. Description of the Conventional Art

In the design and manufacture of electronic equipment, in terms of a reduction in the number of circuit component parts used, as compared with an arrangement in which its electronic circuits are formed by electronic components such as transistors, it is more advantageous to use a transistor module in which a plurality of electronic components are formed as a module in an outer-packaging resin or metal case by being mounted on a circuit board. In such a transistor module, as shown in FIG. 6, an external lead terminal 22 is led from the interior of a transistor module 21 to the exterior of an outer-packaging resin (not shown). This external lead terminal 22 has an intermediate terminal portion 25 bent in the form of, for instance, the letter U and disposed between its internal terminal portion 23 and external terminal portion 24. As a result, even if the transistor module 21 produces heat during the operation and the external lead wire 22 undergoes heat deformation, a bent portion 25a of the intermediate terminal portion 25 absorbs this heat deformation and alleviates a stress with respect to the encapsulating resin, thereby preventing a decline in the reliability of the transistor module 21. In addition, as water or the like is prevented from entering the interior of the transistor module 21 along the external lead terminal 22, its environmental resistance is improved.

However, if the intermediate terminal portion 25 having the bent portion 25a is provided in the external lead terminal 22 of the transistor module 21, a large inductance $L_0$ parasitically occurs in correspondence with the bent shape. For this reason, if the supply of a current with respect to the transistor module 21 is switched on and off at high speed, when the current decreases sharply, a large transient voltage $\Delta V_0$ expressed by $-L_0(dI_0/dt)$ occurs in correspondence with a change in its current $dI_0/dt$. Such a transient voltage $\Delta V_0$ can cause a malfunction or the like in the circuit. Here, to reduce the $\Delta V_0$, it suffices if the intermediate terminal portion 25 is formed into a linear structure to reduce the inductance $L_0$. This, however, impairs the effect of alleviating the heat deformation of the external lead terminal 22 and the effect of enhancing the environmental resistance, thereby causing a decline in the reliability of the transistor module 21. For this reason, with the conventional transistor module 21, there has been the problem that either the reliability or the transient voltage $\Delta V_0$ must be sacrificed.

Accordingly, as shown in FIG. 7, it is conceivable to use an external lead terminal 32 in which a slit 35a is provided in an intermediate terminal portion 35 in the longitudinal direction thereof to provide a plurality of parallel current paths between an external terminal portion 34 and an internal terminal portion 33. In the external lead terminal 32 having such a structure, since the current path is divided, even if the current is switched at high speed, a current $I_1$ flowing through each current path is small, so that a transient voltage $\Delta V_1$ expressed by $-L_1(dI_1/dt)$ is small. However, in the case where the transient voltage $\Delta V_1$ is reduced by dividing the current path by providing the slit 35a, the effect of reducing the transient voltage $\Delta V_1$ is restricted by the number of divisions of the current path. Hence, to reduce the $\Delta V_1$ sufficiently, it is necessary to form a multiplicity of grooves. Accordingly, there are restrictions arising from the sizes and configurations of a transistor module 31 and the external lead terminal 32. For instance, as shown in FIG. 7, in a case where an internal terminal portion 37 is also provided at a position distant from the external terminal portion 34 via an intermediate terminal portion 36 having a bent portion 36a, it is necessary to provide slits 36b between the bent portion 36a and the external terminal portion 34 and provide a slit 36c between the bent portion 36a and the internal terminal portion 37. However, to reduce the transient voltage $\Delta V_1$ sufficiently, it is necessary to form a multiplicity of grooves 36a and 36b, so that it is essential that the width of the intermediate terminal portion 36 be wide. In addition, an increase in the number of the slits 35a, 36b, and 36c formed in the external lead terminal 32 results in an increase in the number of processing operations, and the problem of the increased manufacturing cost of the transistor module 21 also results.

SUMMARY OF THE INVENTION

In view of the above-described problems, an object of the present invention lies in realizing a transistor module capable of reducing the transient voltage without being subjected to restrictions in size while maintaining a high level of reliability such as heat resistance and environmental resistance.

To solve the above-described task, the means adopted in the transistor module in accordance with the present invention is such that an external lead terminal led out from the interior of the module includes an intermediate terminal portion on an inner side of the module, an external terminal portion on an outer side thereof, and an intermediate terminal portion having at least one bent portion conductively connecting the terminal portions, wherein a shortcircuit portion is electrically connected in parallel with the intermediate terminal portion, the shortcircuit portion having a larger electric resistance than that of the intermediate terminal portion and a smaller inductance than that thereof. In the present invention, the transistor module means one in which a semiconductor device together with a circuit board and the like is encapsulated by an outer-packaging resin or a metal case, and include those which are mounted together with other electronic components. Here, as for the shortcircuit portion, it is possible to use one in which it is formed integrally with the external lead terminal, one which is arranged with another wiring member or the like added thereto, or other similar arrangement. As for the external lead terminal as well, it is possible to use one in which the component parts are formed integrally, one in which the component parts are arranged by being connected by soldering, or other similar arrangement.

In the present invention, to ensure that the shortcircuit portion can be arranged in a small area of formation inside the module and that the shortcircuit is less likely to be subjected to restrictions in the configuration and the like of the external lead terminal, it is preferable to adopt a shortcircuit wire secured to a side of the internal terminal portion and a side of the external terminal portion of the intermediate terminal portion in the interior of the module.

In addition, it is preferable to dispose the shortcircuit portion on a side of a shortest-distance line connecting opposite sides of the bent portion of the intermediate terminal portion, so as to reduce the inductance of the shortcircuit portion.

In the transistor module in accordance with the present invention, the shortcircuit portion is electrically connected in parallel with the intermediate terminal portion of the external lead terminal, and since its electric resistance is larger than the electric resistance of the intermediate terminal portion, a steady-state current flows from the external terminal portion to the internal terminal portion via the intermediate terminal portion during the steady operation of the transistor module. In contrast, if the current is suddenly interrupted in the steady-operation state, since the inductance of the shortcircuit portion is smaller than an inductance $L_0$ of the intermediate terminal portion, the current flowing from the external terminal portion to the intermediate terminal portion shifts from the intermediate terminal portion to the shortcircuit portion side. Here, if it is assumed that the inductance at the shortcircuit portion is $L_2$ and that a current rise ratio at the shortcircuit portion is $dI_2/dt$, a transient voltage $\Delta V_2$ occurring in the transistor module in accordance with the present invention is expressed by $L_2 (dI_2/dt)$. However, since an inductance $L_2$ at the shortcircuit portion is smaller than an inductance $L_0$ at the intermediate terminal portion, the transient voltage $\Delta V_2$ is small. Moreover, the shortcircuit portion reduces the transient voltage $\Delta V_2$ by virtue of its electrical characteristics and differs from the structure in which its current path is divided by providing slits or the like in the external lead terminal. Accordingly, the shortcircuit portion is not subjected to restrictions in the size and the configuration of the external lead terminal to reduce the transient voltage $\Delta V_2$.

BRIEF DESCRIPTION OF THE DRAWINGS

FIG. 3A is a graph illustrating a change with time of a current and a voltage in a case where the current is suddenly reduced in the transistor module shown in FIG. 2, while

DETAILED DESCRIPTION OF PREFERRED EMBODIMENTS

Referring next to the accompanying drawings, a description will be given of the embodiments of the present invention.

Embodiment 1

Figure 1:
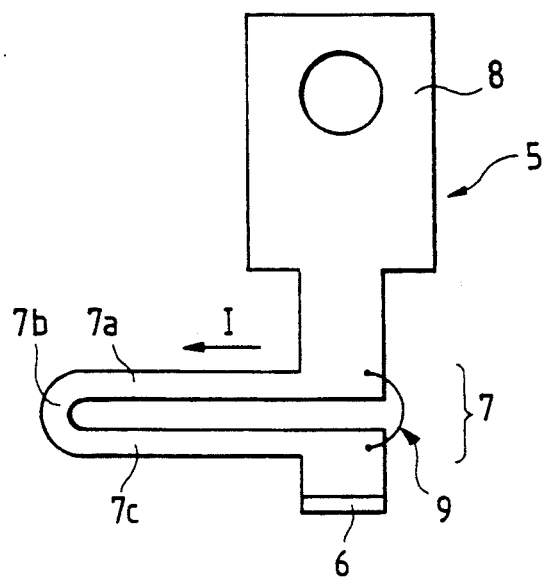
FIG. 1 is a front view of an external lead terminal used in a transistor module in accordance with Embodiment 1 of the present invention.
Figure 2:
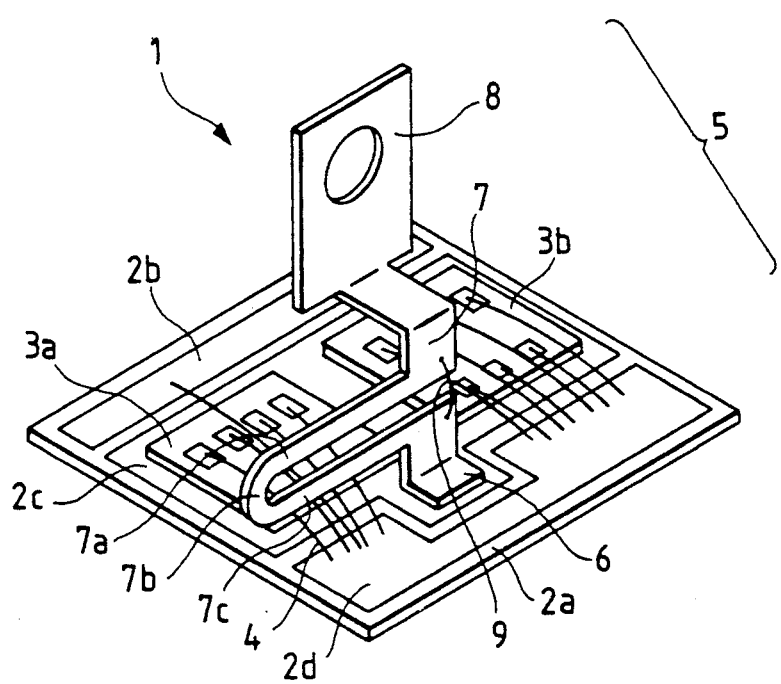
FIG. 2 is a perspective view illustrating an essential portion of the interior of the transistor module using the external lead terminal shown in FIG. 1.

FIG. 1 is a front view of an external lead terminal used in a transistor module in accordance with Embodiment 1 of the present invention, and FIG. 2 is a perspective view illustrating an essential portion of the interior of the transistor module of this embodiment.

As shown in these drawings, a first metal wiring circuit board 2b, a second metal wiring circuit board 2c, and a third metal wiring circuit board 2d are provided on an insulating substrate 2a, such as an alumina plate, in the interior of a transistor module 1, and semiconductor chips 3a, 3b are mounted on the surface thereof. Terminal portions of these semiconductor chips 3a, 3b are wired and connected by means of bonding wires 4, thereby constituting an electric circuit.

Here, an external lead terminal 5 obtained by processing a copper plate or the like is conductively connected to the surface of the second metal wiring circuit board 2c. This external lead terminal 5 comprises an internal terminal portion 6 secured to a side of the second metal wiring circuit plate 2c and an external terminal portion 8 conductively connected to the internal terminal portion 6 via an intermediate terminal portion 7, and all of them are formed integrally. The external terminal portion 8 among them is in a state in which it projects to the outside from an encapsulating resin layer (not shown) even after the transistor module is encapsulated with a resin. This external terminal portion 8 is used for conductive connection between the transistor module 1 and an external circuit.

Here, in the transistor module 1, the intermediate terminal portion 7 includes a straight portion 7a, a curved portion 7b (bent portion), and a straight portion 7c and thus has a configuration in which it is bent in the form of the letter U. This arrangement is provided to ensure that, even if the external lead terminal 5 undergoes heat deformation due to heat generation during the operation, the heat deformation is absorbed by the intermediate terminal portion 7 so as not to affect the reliability of the transistor module 1, and to ensure that adhesion and the like at an interface between the encapsulating resin and the external lead terminal 5 is increased so as to enhance the environmental resistance of the transistor module 1. In addition, in the intermediate terminal portion 7, two bent portions, which are bent in the direction of the plate thickness, are formed between the straight portion 7a and the external terminal portion 8. Also, one bent portion similarly bent in the direction of the plate thickness is formed between the straight portion 7c and the internal terminal portion 6.

Furthermore, in the transistor module 1 of this embodiment, with respect to the external lead terminal 5, a shortcircuit wire 9 is secured to a side of the external terminal portion 8 and a side of the internal terminal portion 6 in a state in which the shortcircuit wire 9 is electrically connected in parallel with the intermediate terminal portion 7. Here, the shortcircuit wire 9 is a short wire which is a wire-like member formed of a selected predetermined material, and is located at a shortest-distance line side connecting the two sides of the curved portion 7b of the intermediate terminal portion 7. Therefore, its electric resistance is sufficiently larger than the electric resistance of the intermediate terminal portion 7, and its inductance is sufficiently smaller than the inductance of the intermediate terminal portion 7.

Thus, in the transistor module 1 of this embodiment, since the shortcircuit wire 9 having a large electric resistance is connected in parallel with the intermediate terminal portion 7 of the external lead terminal 5, during the steady operation of the transistor module 1, a steady-state current (in the direction of arrow I) flows from the external terminal portion 8 to the internal terminal portion 6 via the intermediate terminal portion 7, and practically no current flows across the shortcircuit wire 9. In this state, when the current is suddenly interrupted, since the inductance of the shortcircuit portion 9 is sufficiently smaller than an inductance $L_0$ of the intermediate terminal portion 7, the current flowing from the external terminal portion 8 to the intermediate terminal portion 7 shifts from the side of the intermediate terminal portion 7 to the side of the shortcircuit portion 9. Here, if it is assumed that the inductance at the shortcircuit portion 9 is $L_2$ and that a current rise ratio at the shortcircuit portion 9 is $dI_2/dt$, a transient voltage $\Delta V_2$ occurring in the transistor module 1 of this embodiment is expressed by $L_2 (dI_2/dt)$. However, since (inductance $L_0$ at the intermediate terminal portion 7) > (inductance $L_2$ at the shortcircuit portion 9), the transient voltage $\Delta V_2$ occurring in the transistor module 1 of this embodiment is extremely smaller than a transient voltage $\Delta V_0$ occurring in the conventional transistor module (having a structure not provided with the shortcircuit wire 9). Moreover, the shortcircuit portion 9 reduces the transient voltage $\Delta V_2$ by virtue of its electrical characteristics and differs from the structure in which its current path is divided by providing slits or the like in the external lead terminal 5. Accordingly, the shortcircuit portion 9 can be arranged in a most effective state irrespective of the size and the configuration of the external lead terminal 5. Therefore, the transient voltage $\Delta V_2$ can be reduced with respect to various types of transistor modules while their reliability is being held at a high level.

Figure 6:
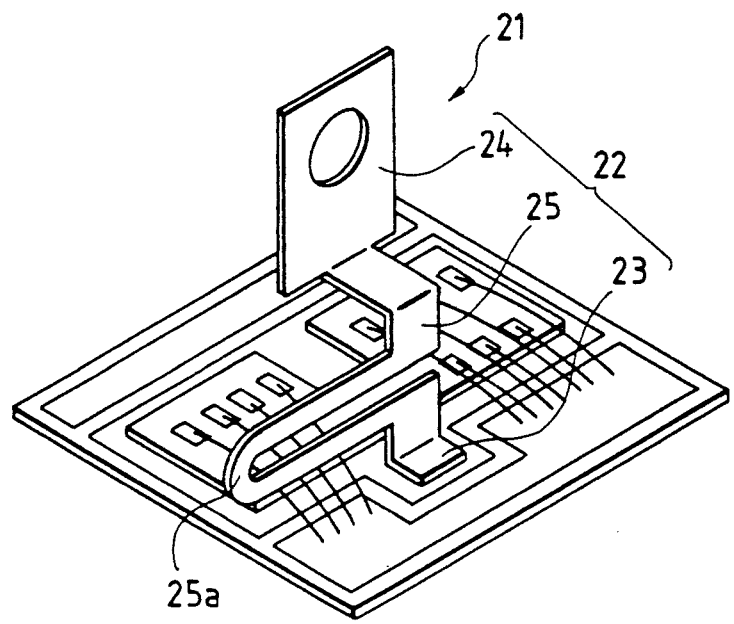
FIG. 6 is a perspective view illustrating an essential portion of the interior of a conventional transistor module.

Here, with reference to FIG. 3A, a description will be given of a change with time of a current and a voltage in a case where the current is suddenly interrupted with respect to the transistor module 1 in a state in which a steady-state current is flowing. Here, FIG. 3B shows the change with time of a current and a voltage of the conventional transistor module shown in FIG. 6, i.e., the transistor module not having the shortcircuit portion connected in parallel with the intermediate terminal portion. It should be noted that in FIGS. 3A and 3B solid lines 51, 52 show a current value, while broken lines 53, 54 show a voltage value.

Figure 3A:
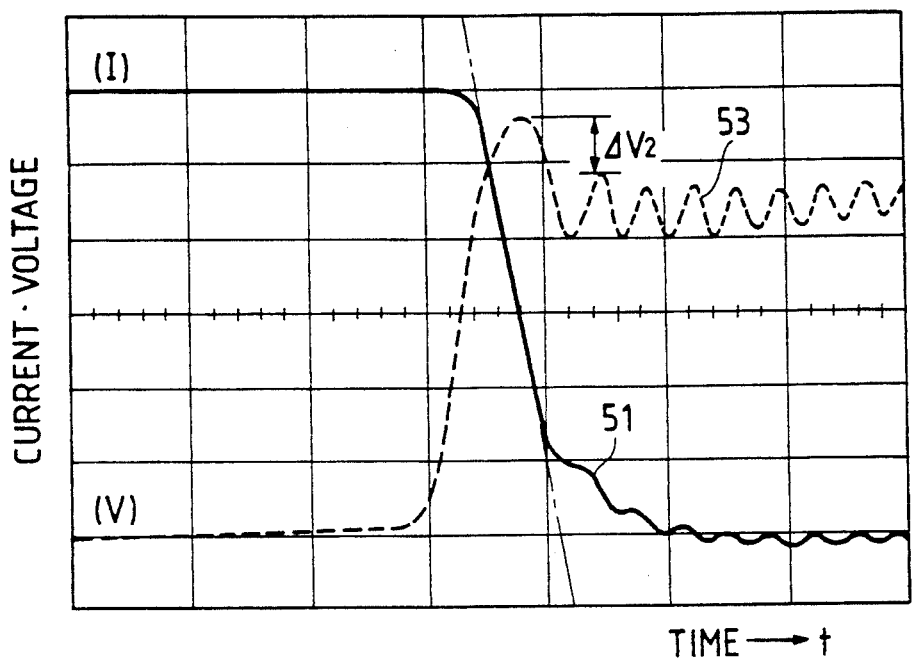
Figure 3B:
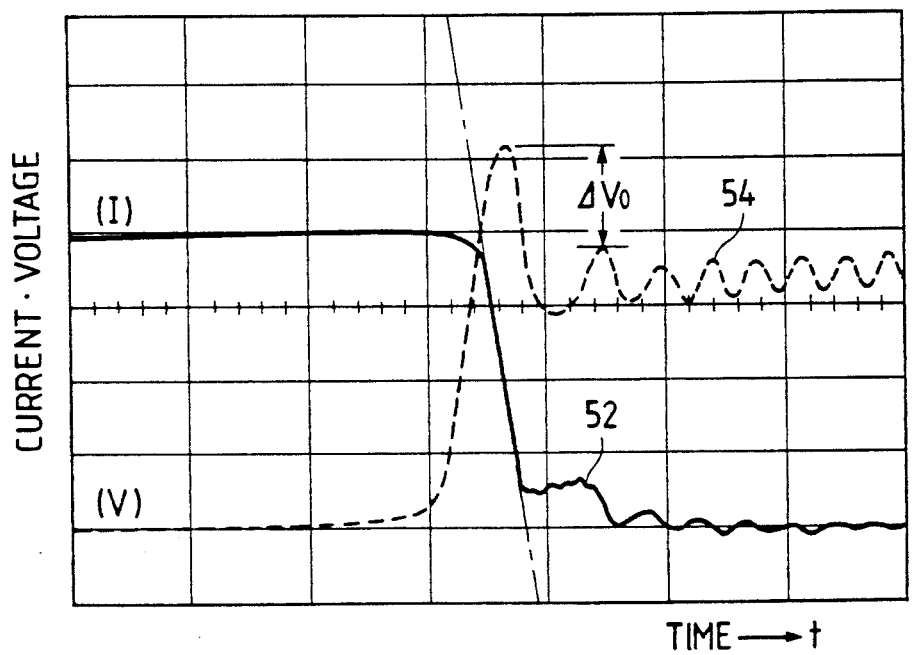
FIG. 3B is a graph illustrating a change with time of a current and a voltage in a case where the current is suddenly reduced in a conventional transistor module.

As shown in FIGS. 3A and 3B, in any of the transistor modules, if a fixed steady-state current I is decreased sharply in the state in which the current I is allowed to flow, as indicated by the broken lines 53, 54, a voltage V at the external lead terminal, after rising sharply, shows a predetermined peak voltage, and subsequently converges into a fixed value. Here, although, as for the transient voltage, a comparison is generally made of a difference between a converged value and a peak voltage, in FIGS. 3A and 3B, a comparison is alternatively made of the differences $\Delta V_1$, $\Delta V_2$ between the voltage value after showing the peak voltage on the one hand, and the peak voltage on the other. From these results, it was confirmed that the transient voltage $\Delta V_2$ occurring in the transistor module 1 of this embodiment is about 25 to 50% lower than the transient voltage $\Delta V_0$ occurring in the conventional transistor module.

Embodiment 2

Figure 4:
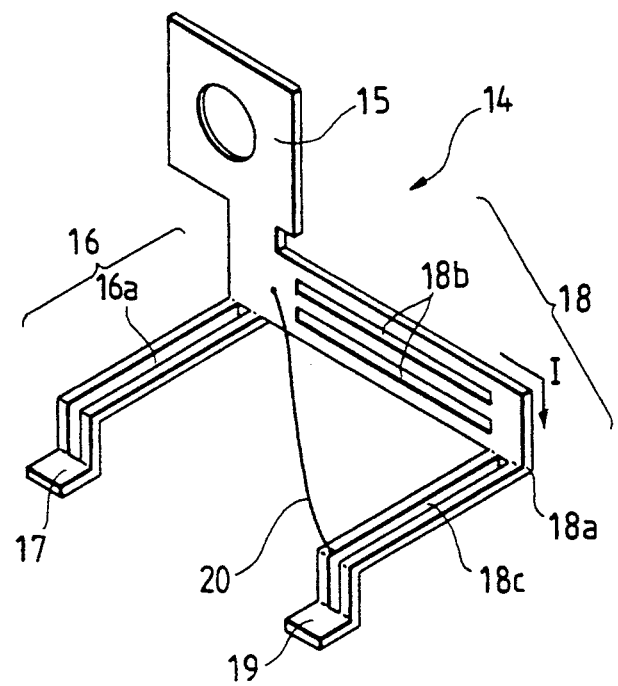
FIG. 4 is a perspective view illustrating an external lead terminal used in a transistor module in accordance with Embodiment 2 of the present invention.
Figure 5:
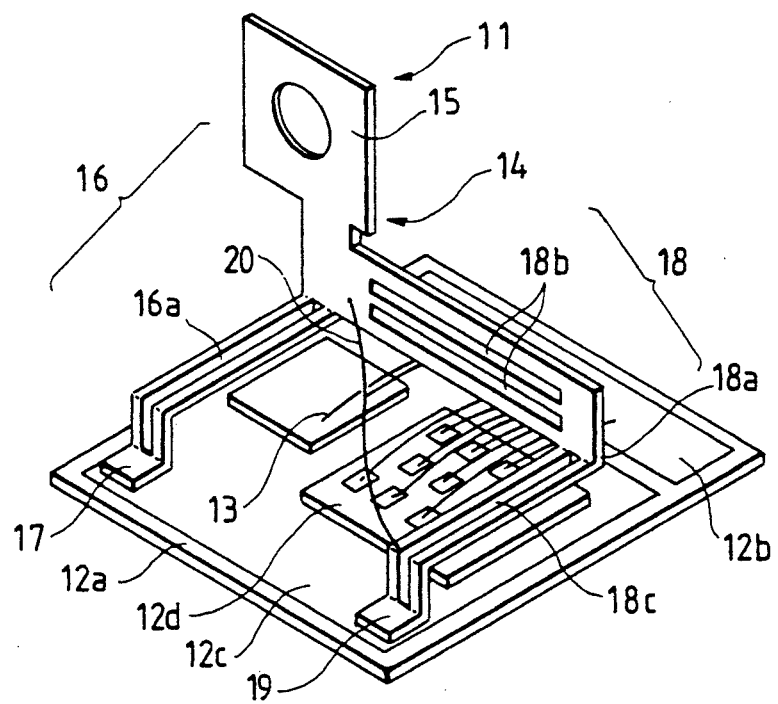
FIG. 5 is a perspective view illustrating an essential portion of a transistor module using the external lead terminal shown in FIG. 4.

FIG. 4 is a perspective view of the external lead terminal used in a transistor module in accordance with Embodiment 2 of the present invention, and FIG. 5 is a perspective view illustrating an essential portion of the interior of the transistor module of this embodiment.

As shown in these drawings, a first metal wiring circuit board 12b and a second metal wiring circuit board 2c are provided on an insulating substrate 12a, such as an alumina plate, in the interior of a transistor module 11, and a semiconductor chip 12d and the like are mounted on the surface thereof. Terminal portions of the semiconductor chip 12d and the like are wired and connected by means of bonding wires 13, thereby constituting an electric circuit. Here, an external lead terminal 14 formed of a copper plate processed into a predetermined configuration is conductively connected to the surface of the second metal wiring circuit board 12c. This external lead terminal 14 is conductively connected to the surface of the second metal wiring circuit board 12c at two positions by means of a first internal terminal portion 6 conductively connected to an external terminal portion 15 via a first intermediate terminal portion 16 and by means of a second internal terminal portion 19 conductively connected to the external terminal portion 15 via a second intermediate terminal portion 18.

Here, the external lead terminal 14 is processed integrally from a copper plate or the like, and a slit 16a is formed in the first intermediate terminal portion 16 to divide the electrical path there into two rows. In contrast, two slits 18b are formed in the second intermediate terminal portion 18 between its bent portion 18a and the external terminal portion 15 to divide the electrical path there into three rows, and one slit is formed between the bent portion 18a and the internal terminal portion 19 to divide the electrical path there into two rows. As a result, even if the current flowing through the transistor module 11 is suddenly decreased, the current flowing across the first and second intermediate terminal portions 16, 18 is branched into the electrical paths divided by the slits 16a, 18b, 18c. Hence, since current values at the respective current paths are small, the transient voltage occurring in the external terminal portion 15 due to the sharp decrease in current is suppressed.

However, in the transistor module 11, it is necessary to further reduce the transient voltage which occurs due to an inductance $L_1$ parasitic on the intermediate terminal portion 18 side. However, the situation is such that it is difficult to further divide the electrical path of the intermediate terminal portion 18 owing to restrictions in configuration and size of the external lead terminal 14.

Accordingly, in the transistor module of this embodiment, with respect to the external lead terminal 14, a shortcircuit wire 20 is disposed between a side of the external terminal portion 15 of the intermediate terminal portion 18 and a side of the intermediate terminal portion 19 of the intermediate terminal portion 18 in a state in which the shortcircuit wire 20 is located at a shortest-distance line side connecting the two sides of the bent portions 18a of the intermediate terminal portion 18. Here, the shortcircuit wire 20 is a short wire which is a wire-like member formed of a selected predetermined material, and is located at a shortest-distance line side connecting the two sides of the bent portion 18a of the intermediate terminal portion 18. Therefore, its electric resistance is sufficiently larger than the electric resistance of the intermediate terminal portion 18, and its inductance is sufficiently smaller than the inductance of the intermediate terminal portion 18.

Thus, in the transistor module 11 of this embodiment, since the shortcircuit wire 20 is connected in parallel with the intermediate terminal portion 18 and its electric resistance is larger than the electric resistance of the intermediate terminal portion 18, during the steady operation of the transistor module 11, the steady-state current (in the direction of arrow I) flows from the external terminal portion 15 to the intermediate terminal portion 19 via the intermediate terminal portion 18, and practically no current flows across the shortcircuit wire 20. In this state, when the current is suddenly interrupted, since the inductance of the shortcircuit portion 20 is smaller than the inductance $L_1$ of the intermediate terminal portion 18, the current flowing from the external terminal portion 15 to the intermediate terminal portion 18 shifts from the side of the intermediate terminal portion 18 to the side of the shortcircuit portion 20. Here, if it is assumed that the inductance at the shortcircuit portion 9 is $L_3$ and that a current rise ratio at the shortcircuit portion is $dI_3/dt$, a transient voltage $\Delta V_3$ occurring in the transistor module 11 of this embodiment is expressed by $L_3 (dI_3/dt)$. However, since $L_1 > L_3$ in the same way as the inductance $L_2$ at the shortcircuit wire of Embodiment 1, the transient voltage $\Delta V_3$ is small. Moreover, since the shortcircuit portion 20 can be arranged without being subjected to restrictions in configuration and size of the external lead terminal 15, the transient voltage can be reduced while the reliability of the transistor module 11 is being held at a high level.

Figure 7:
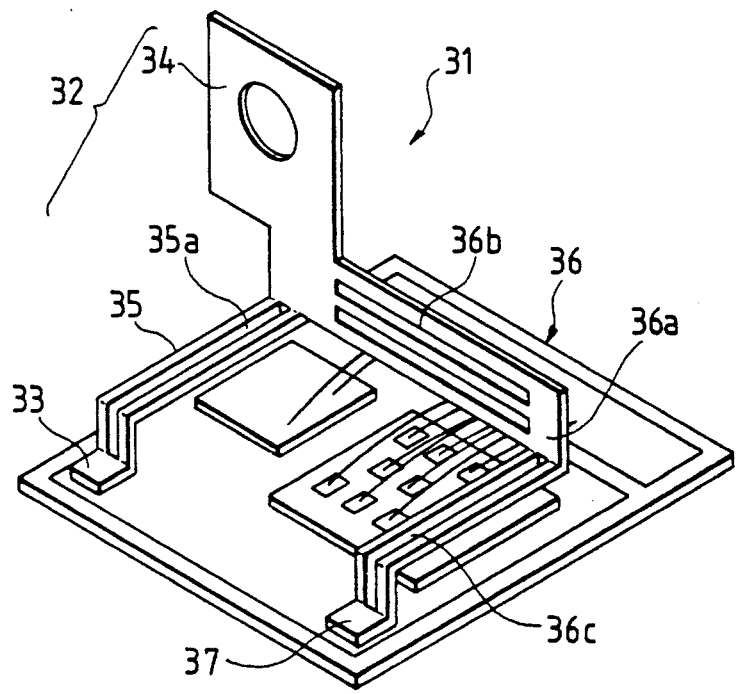
FIG. 7 is a perspective view illustrating an essential portion of the interior of a transistor module using an external lead terminal different from the external lead terminal shown in FIG. 6.

Here, with respect to the transistor module 11 as well, a measurement was made of a change with time of the current and the voltage in the case where the current is suddenly interrupted in a state in which a steady-state current is flowing, and a comparison was made with the change with time of the current and the voltage of the conventional transistor module shown in FIG. 7, i.e., the transistor module not having the shortcircuit portion connected in parallel with the intermediate terminal portion. It was confirmed that the transient voltage occurring in the transistor module 11 of this embodiment is lower by about 25 to 50%.

It should be noted that, in addition to the configurations shown in Embodiments 1 and 2, the configuration of the external lead terminal is not limited insofar as it has the intermediate terminal portion on the inner side of the module, the external terminal portion on the outer side thereof, and the iii having at least one bent portion conductively connecting these terminal portions. In addition, the shortcircuit portion is not limited insofar as it provides an electric parallel connection with a large electric resistance and a small inductance.

In addition, the number of the external lead terminals provided on the transistor module as well as the number of the external terminal portions, internal terminal portions and intermediate terminal portions provided in the external lead terminal are of a nature that they should be set to optimum conditions in the light of the usage of the transistor module.

Furthermore, as for the external lead terminal, it is possible to use one in which the component parts are formed integrally, one in which the component parts are arranged by being connected, or other similar arrangement. As for the shortcircuit portion as well, it is possible to use one in which it is formed integrally with the external lead terminal, one in which another wiring member or the like is added to the external lead terminal portion, or other similar arrangement.

As described above, the transistor module in accordance with the present invention is characterized in that a shortcircuit portion having a larger electric resistance than that of the intermediate terminal portion and a smaller inductance than the inductance thereof is connected in parallel with the intermediate terminal portion having a bent portion. Accordingly, in accordance with the present invention, the steady-state current flows from the external-connection terminal portion to the internal-connection terminal portion via the intermediate terminal portion, while, when the current is interrupted suddenly, the current shifts from the intermediate terminal portion side to the shortcircuit portion side having a smaller inductance. Hence, the present invention demonstrates the effect of reducing the transient voltage. In addition, since it suffices to merely provide the shortcircuit portion, the transient voltage can be reduced without being affected by restrictions in the size and configuration of the external lead terminal.

In addition, in the case where the shortcircuit wire with both ends secured to the intermediate terminal portion side and the external terminal portion side of the iii in the module is used as the shortcircuit portion, the shortcircuit portion can be arranged in a smaller area of formation, so that the shortcircuit portion is less likely to be subjected to restrictions in the size and configuration of the external lead terminal. In addition, it is readily possible to form a shortcircuit portion having a large electric resistance.

Furthermore, in the case where the shortcircuit portion is arranged on the shortest-distance-line side connecting the both sides of the bent portion of the intermediate terminal portion, it is readily possible to form a shortcircuit portion having a small inductance.

What is claimed is:

1. A transistor module having a lead terminal extending from the interior of said module through an outer cover of said module and protruding from said outer cover, said lead terminal comprising:
    an internal terminal portion on an inner side of said cover;
    an external terminal portion extending through and protruding from said cover;
    an intermediate terminal portion having at least one bent portion conductively connecting said internal and external terminal portions; and
    a shortcircuit element electrically connected in parallel with said intermediate terminal portion, said shortcircuit element having a larger electric resistance than that of said intermediate terminal portion and a smaller inductance than that of said intermediate terminal portion.

2. A transistor module as claimed in claim 1, wherein said shortcircuit element is a shortcircuit wire having a first end conductively connected to a side of said internal terminal portion and a second end secured to a side of said external terminal portion in the interior of said module.

3. A transistor module as claimed in claim 1, wherein said shortcircuit element is disposed on a side of said intermediate terminal portion having a shortest-distance line connecting opposite sides of said bent portion of said intermediate terminal portion.

4. A transistor module as claimed in claim 2, wherein said shortcircuit element is disposed on a side of said intermediate terminal portion corresponding to a shortest-distance line connecting opposite ends of said bent portion of said intermediate terminal portion.

5. An external lead terminal led out from a transistor module in which a plurality of electronic components are mounted on a circuit board, said external lead terminal comprising:

an internal terminal portion in an interior of said module;

an external terminal portion protruding from said module;

an intermediate terminal portion having at least one bent portion conductively connecting said internal and external terminal portions; and a shortcircuit element electrically connected in parallel with said intermediate terminal portion, said shortcircuit element having a larger electric resistance than that of said intermediate terminal portion and a smaller inductance than that of said intermediate terminal portion.

6. A transistor module as claimed in claim 5, wherein said shortcircuit element is a shortcircuit wire having a first end conductively connected to a side of said intermediate terminal portion connected to said internal terminal portion and a second end connected to a side of said intermediate portion connected to said external terminal portion in the interior of said module.

* * * * *